US012658882B2

(12) United States Patent
Koh et al.

(10) Patent No.: US 12,658,882 B2
(45) Date of Patent: Jun. 16, 2026

(54) BULK ACOUSTIC WAVE RESONANT STRUCTURE AND PREPARATION METHOD THEREFOR, AND ACOUSTIC WAVE DEVICE

(71) Applicant: WUHAN YANXI MICRO COMPONENTS CO., LTD., Wuhan (CN)

(72) Inventors: Zhi Wei Koh, Wuhan (CN); Re-Ching Lin, Wuhan (CN); Pei-Chun Liao, Wuhan (CN); Wei-sheng Huang, Wuhan (CN); Dapeng Zhang, Wuhan (CN)

(73) Assignee: WUHAN YANXI MICRO COMPONENTS CO., LTD., Wuhan (CN)

( * ) Notice: Subject to any disclaimer, the term of this patent is extended or adjusted under 35 U.S.C. 154(b) by 155 days.

(21) Appl. No.: 18/695,353

(22) PCT Filed: Sep. 23, 2022

(86) PCT No.: PCT/CN2022/121119
§ 371 (c)(1),
(2) Date: Mar. 25, 2024

(87) PCT Pub. No.: WO2023/061192
PCT Pub. Date: Apr. 20, 2023

(65) Prior Publication Data
US 2024/0405746 A1      Dec. 5, 2024

Related U.S. Application Data

(60) Provisional application No. 63/262,586, filed on Oct. 15, 2021.

(51) Int. Cl.
*H03H 9/17*          (2006.01)
*H03H 3/02*          (2006.01)
(Continued)

(52) U.S. Cl.
CPC ................ *H03H 9/17* (2013.01); *H03H 3/02* (2013.01); *H03H 9/02015* (2013.01);
(Continued)

(58) Field of Classification Search
CPC ............ H03H 9/13; H03H 9/171; H03H 9/17; H03H 9/02125; H03H 9/02015;
(Continued)

(56) References Cited

U.S. PATENT DOCUMENTS 8,084,919 B2 * 12/2011 Nishihara .............. H03H 9/568
310/320
9,203,374 B2 * 12/2015 Burak ................ H03H 9/02086
(Continued)

FOREIGN PATENT DOCUMENTS

CN          106100601 A      11/2016
CN          107453729 A      12/2017
(Continued)

OTHER PUBLICATIONS

Partial Supplementary European Search Report in the European application No. 22880131.2, mailed on Apr. 16, 2025, 6 pages.
(Continued)

*Primary Examiner* — Quan Tra
(74) *Attorney, Agent, or Firm* — Syncoda LLC; Feng Ma

(57) ABSTRACT

A bulk acoustic wave resonant structure and a preparation method therefor, and an acoustic wave device are provided. The bulk acoustic wave resonant structure includes: a substrate; a reflection structure, a first electrode, a piezoelectric layer and a second electrode, which are successively located on the substrate, wherein the first electrode comprises a first sub-electrode located in a first region and a second sub-electrode located in a second region other than the first region, and the piezoelectric layer respectively comes into direct contact with the first sub-electrode and the second (Continued)

electrode in the first region; and a first gap, which is located between the piezoelectric layer and the second sub-electrode, wherein an orthographic projection of the first gap on the substrate surrounds the first region.

11 Claims, 8 Drawing Sheets

(51) Int. Cl.
   *H03H 9/02* (2006.01)
   *H03H 9/13* (2006.01)
(52) U.S. Cl.
   CPC ...... *H03H 9/0211* (2013.01); *H03H 9/02125* (2013.01); *H03H 9/02157* (2013.01); *H03H 9/13* (2013.01); *H03H 9/171* (2013.01); *H03H 9/173* (2013.01); *H03H 2003/021* (2013.01)
(58) Field of Classification Search
   CPC .......... H03H 9/173; H03H 9/131; H03H 3/02; H03H 9/02118; H03H 9/0211; H03H 9/564; H03H 9/02157; H03H 2003/021; H03H 9/132
   See application file for complete search history.

(56) References Cited

U.S. PATENT DOCUMENTS

| | | | | |
|---|---|---|---|---|
| 10,469,049 | B2 | 11/2019 | Liu | |
| 10,700,660 | B2 | 6/2020 | Choy | |
| 2016/0308509 | A1* | 10/2016 | Burak | .................... H03H 9/132 |
| 2017/0207768 | A1 | 7/2017 | Liu et al. | |
| 2019/0123708 | A1 | 4/2019 | Choy et al. | |
| 2019/0379344 | A1 | 12/2019 | Wang | |
| 2020/0195221 | A1 | 6/2020 | Ko | |

FOREIGN PATENT DOCUMENTS

| | | | | | |
|---|---|---|---|---|---|
| CN | 109714016 | A | | 5/2019 | |
| CN | 110868170 | A | * | 3/2020 | ............... H03H 3/02 |
| CN | 110868178 | A | | 3/2020 | |
| CN | 111030629 | A | | 4/2020 | |
| CN | 111030631 | A | | 4/2020 | |
| CN | 111245393 | A | | 6/2020 | |
| CN | 111384911 | A | | 7/2020 | |
| CN | 111884617 | A | * | 11/2020 | ............... H03H 9/02 |
| CN | 112003581 | A | | 11/2020 | |
| CN | 112039469 | A | | 12/2020 | |
| CN | 112039471 | A | | 12/2020 | |
| CN | 112117986 | A | | 12/2020 | |
| CN | 113346864 | A | | 9/2021 | |
| EP | 3907884 | A1 | | 11/2021 | |
| JP | 2003505906 | A | | 2/2003 | |
| JP | 2005109702 | A | | 4/2005 | |
| JP | 2007116383 | A | | 5/2007 | |
| JP | 2010130294 | A | | 6/2010 | |
| JP | 2013138425 | A | | 7/2013 | |
| JP | 2020088680 | A | | 6/2020 | |
| KR | 20050072576 | A | | 7/2005 | |
| KR | 20160069263 | A | | 6/2016 | |
| KR | 20180107852 | A | | 10/2018 | |
| KR | 20190139395 | A | | 12/2019 | |
| WO | 2009013938 | A1 | | 1/2009 | |
| WO | 2013175985 | A1 | | 11/2013 | |

OTHER PUBLICATIONS

International Search Report in the international application No. PCT/CN2022/121117, mailed on Nov. 24, 2022, 2 pages.
English translation of the Written Opinion of the International Search Authority in the international application No. PCT/CN2022/121117, mailed on Nov. 24, 2022, 3 pages.
International Search Report in the international application No. PCT/CN2022/121118, mailed on Nov. 29, 2022, 2 pages.
English translation of the Written Opinion of the International Search Authority in the international application No. PCT/CN2022/121118, mailed on Nov. 29, 2022, 4 pages.
International Search Report in the international application No. PCT/CN2022/121119, mailed on Dec. 1, 2022, 2 pages.
English translation of the Written Opinion of the International Search Authority in the international application No. PCT/CN2022/121119, mailed on Dec. 1, 2022, 4 pages.
Partial Supplementary European Search Report in the European application No. 22880130.4, mailed on Apr. 24, 2025.
Supplementary European Search Report in the European application No. 22880130.4, mailed on Jul. 15, 2025.

* cited by examiner

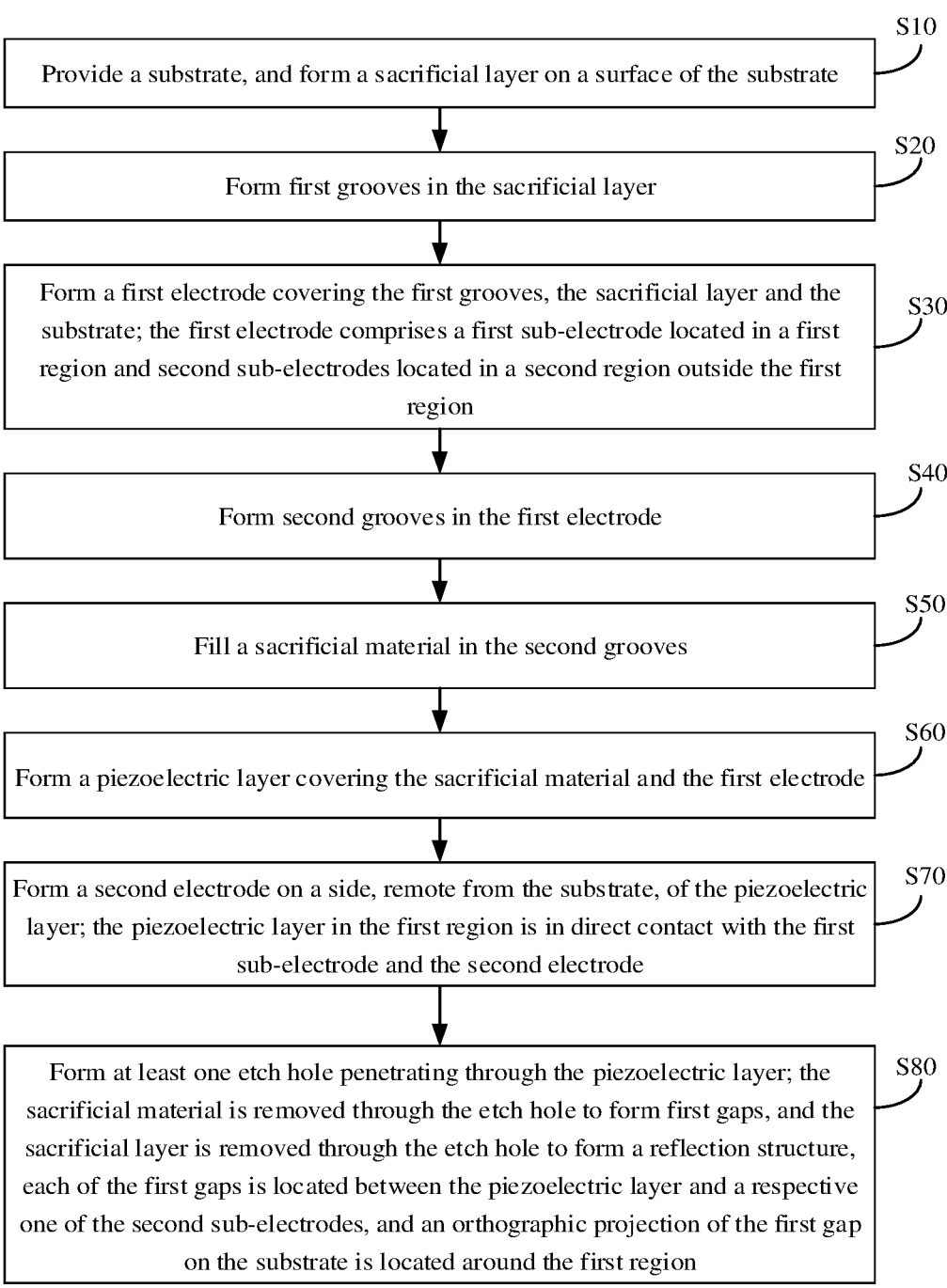

S10
Provide a substrate, and form a sacrificial layer on a surface of the substrate S20
Form first grooves in the sacrificial layer S30
Form a first electrode covering the first grooves, the sacrificial layer and the substrate; the first electrode comprises a first sub-electrode located in a first region and second sub-electrodes located in a second region outside the first region S40
Form second grooves in the first electrode S50
Fill a sacrificial material in the second grooves S60
Form a piezoelectric layer covering the sacrificial material and the first electrode S70
Form a second electrode on a side, remote from the substrate, of the piezoelectric layer; the piezoelectric layer in the first region is in direct contact with the first sub-electrode and the second electrode S80
Form at least one etch hole penetrating through the piezoelectric layer; the sacrificial material is removed through the etch hole to form first gaps, and the sacrificial layer is removed through the etch hole to form a reflection structure, each of the first gaps is located between the piezoelectric layer and a respective one of the second sub-electrodes, and an orthographic projection of the first gap on the substrate is located around the first region

FIG. 7

BULK ACOUSTIC WAVE RESONANT STRUCTURE AND PREPARATION METHOD THEREFOR, AND ACOUSTIC WAVE DEVICE

CROSS-REFERENCE OF RELATED APPLICATIONS

This is a national stage of International Application No. PCT/CN2022/121119, filed on Sep. 23, 2022, which claims priority to U.S. Provisional Patent Application No. 63/262, 586 filed on Oct. 15, 2021. The disclosures of the above-referenced applications are hereby incorporated by reference in their entirety.

TECHNICAL FIELD

The present disclosure relates to the technical field of semiconductors, in particular to a bulk acoustic wave resonance structure, a preparation method of a bulk acoustic wave resonance structure and an acoustic wave device.

BACKGROUND

In a widely used communication device such as a mobile telephone, an acoustic wave device using acoustic waves is generally included as a filter of the communication device. As examples of the acoustic wave device, there are devices using Surface Acoustic Wave (SAW), devices using Bulk Acoustic Wave (BAW), and the like. The performance of the acoustic wave device will affect the communication effect of the communication device.

With the development of the communication technology, how to improve the performance of the acoustic wave device while conforming to the development trend of integration and miniaturization of the communication device has become an urgent problem to be solved.

SUMMARY

In a first aspect, an embodiment of the present disclosure provides a bulk acoustic wave resonance structure which includes: a substrate; a reflection structure, a first electrode, a piezoelectric layer and a second electrode that are sequentially located on the substrate; and first gaps. The first electrode includes a first sub-electrode located in a first region and second sub-electrodes located in a second region outside the first region. The piezoelectric layer in the first region is in direct contact with the first sub-electrode and the second electrode. The first gaps are located between the piezoelectric layer and the second sub-electrodes. An orthographic projection of each of the first gaps on the substrate is located around the first region.

In a second aspect, an embodiment of the present disclosure provides an acoustic wave device, which includes a bulk acoustic wave resonance structure according to the above embodiment.

In a third aspect, an embodiment of the present disclosure provides a preparation method of a bulk acoustic wave resonance structure, which includes following operations.

A substrate is provided, and a sacrificial layer is formed on a surface of the substrate.

First grooves are formed in the sacrificial layer.

A first electrode covering the first grooves, the sacrificial layer and the substrate is formed. The first electrode includes a first sub-electrode located in a first region and second sub-electrodes located in a second region outside the first region.

Second grooves are formed in the first electrode.

A sacrificial material is filled in the second grooves.

A piezoelectric layer covering the sacrificial material and the first electrode is formed.

A second electrode is formed on a side, remote from the substrate, of the piezoelectric layer. The piezoelectric layer in the first region is in direct contact with the first sub-electrode and the second electrode.

At least one etch hole penetrating through the piezoelectric layer is formed. The sacrificial material is removed through the etch hole to form first gaps, and the sacrificial layer is removed through the etch hole to form a reflection structure. Each of the first gaps is located between the piezoelectric layer and a respective one of the second sub-electrodes, and an orthographic projection of the first gap on the substrate is located around the first region.

In a fourth aspect, an embodiment of the present disclosure provides a preparation method of a bulk acoustic wave resonance structure, which includes following operations.

A substrate is provided, and a sacrificial layer is formed on a surface of the substrate.

The sacrificial layer is etched to remove a part of the sacrificial layer to form first grooves.

A first electrode material is filled in the first grooves.

A first electrode covering the first electrode material, the sacrificial layer, and the substrate is formed. The first electrode includes a first sub-electrode located in a first region and second sub-electrodes located in a second region outside the first region.

The first electrode is etched to remove a part of the first electrode to form second grooves. The second grooves expose a part of the first electrode material.

A sacrificial material is filled in the second grooves.

A piezoelectric layer covering the sacrificial material and the first electrode is formed.

A second electrode is formed on a side, remote from the substrate, of the piezoelectric layer. The piezoelectric layer in the first region is in direct contact with the first sub-electrode and the second electrode.

At least one etch hole penetrating through the piezoelectric layer is formed. The sacrificial material is removed through the etch hole to form first gaps, and the sacrificial layer is removed through the etch hole to form a reflection structure. Each of the first gaps is located between the piezoelectric layer and a respective one of the second sub-electrodes, and an orthographic projection of the first gap on the substrate is located around the first region.

In a fifth aspect, an embodiment of the present disclosure provides a preparation method of a bulk acoustic wave resonance structure, which includes following operations.

A substrate is provided, and a sacrificial layer is formed on a surface of the substrate.

First electrode material protrusions are formed on the substrate. Each of the first electrode material protrusions covers a part of a sidewall of the sacrificial layer.

A first electrode covering the first electrode material protrusions, the sacrificial layer and the substrate is formed. The first electrode includes a first sub-electrode located in a first region and second sub-electrodes located in a second region outside the first region.

The first electrode is etched to remove a part of the first electrode to form second grooves.

A sacrificial material is filled in the second grooves.

A piezoelectric layer covering the sacrificial material and the first electrode is formed.

A second electrode is formed on a side, remote from the substrate, of the piezoelectric layer. The piezoelectric layer in the first region is in direct contact with the first sub-electrode and the second electrode.

At least one etch hole penetrating through the piezoelectric layer is formed, the sacrificial material is removed through the etch hole to form first gaps, and the sacrificial layer is removed through the etch hole to form a reflection structure. Each of the first gaps is located between the piezoelectric layer and a respective one of the second sub-electrodes, and an orthographic projection of the first gap on the substrate is located around the first region.

BRIEF DESCRIPTION OF THE DRAWINGS

In the drawings, unless otherwise specified, the same reference numerals throughout multiple drawings indicates the same or similar components or elements. These drawings are not necessarily drawn to scale. It is to be understood that these drawings only depict some implementation modes disclosed according to the disclosure and should not be regarded as limitation of the scope of the disclosure.

FIG. 7 is a flowchart of a preparation method of a bulk acoustic wave resonance structure according to an embodiment of the present disclosure.

DETAILED DESCRIPTION

Figure 1:
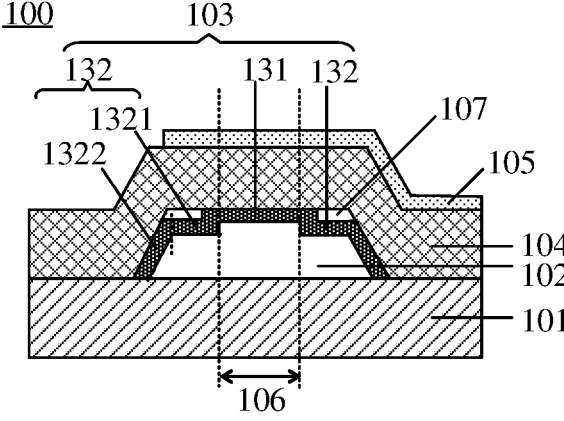
FIG. 1 is a first sectional schematic diagram of a bulk acoustic wave resonance structure according to an embodiment of the present disclosure.

The technical solutions of the disclosure are described below in detail in combination with the drawings of the description and specific embodiments.

In the embodiments of the disclosure, the terms "first", "second" or the like are used to distinguish similar objects, and are not used to describe a particular order or sequence.

In the embodiments of the disclosure, the term "A is in contact with B" includes a case where A is in direct contact with B, or a case where A is in indirectly contact with B with other components interposed between A and B.

In the embodiments of the disclosure, the term "layer" refers to a material part including a region with a thickness. A layer may extend on the entirety of an upper structure or a lower structure, or may have a scope that is smaller than the scope of the upper structure or the lower structure. In addition, a layer may be a region of a homogeneous or non-homogeneous continuous structure that a thickness of the layer is less than the thickness of a continuous structure. For example, a layer may be located between the top surface and the bottom surface of a continuous structure, or a layer may be located between any pair of horizontal planes at the top surface and bottom surface of the continuous structure. A layer may extend horizontally, vertically, and/or along an inclined surface. Further, a layer may include multiple sub-layers.

It is to be understood that the terms "on" "above" and "over" in the disclosure should be interpreted in the broadest manner such that "on" not only denotes "on" something without any intervening feature or layer (i.e., directly on something), but also "on" something with an intervening feature or layer.

Resonator includes dielectric resonator, surface acoustic wave resonator, and bulk acoustic wave resonator. The large power capacity of dielectric resonator is the advantage of this technology, but the large size cannot satisfy the development of chip miniaturization and integration well. In addition, currently in the field of mobile communication, frequency difference between different frequency bands is getting smaller, which makes higher requirements on signal selectivity of the filter, and thus devices are required to have a higher quality factor (Q value).

Surface acoustic wave resonator has been widely used in commercial products due to higher operating frequency, low phase noise, high Q value, lower insertion loss, and simple preparation process below 2 GHz frequency band. However, with the development of 5G communication, the application of surface acoustic wave resonator in the field of high-frequency communication has been limited due to the size limitation of interdigitated electrodes.

The resonance frequency of a bulk acoustic wave resonator depends on various factors, such as the piezoelectric material, different production methods, and the influence of the manufacturing process, especially the material thickness of the piezoelectric material. Bulk acoustic wave resonator may achieve an operating frequency far higher than an operating frequency of surface acoustic wave resonator, and the size shrinks as the frequency increases. Therefore, bulk acoustic wave resonator has an advantage of smaller size, and play an important role in the field of communication. The Film Bulk Acoustic Resonator (FBAR), as a branch of bulk acoustic wave resonator, has been greatly improved with the development of communication technology, and the related filter and duplexer have achieved a commercial large-scale application in the field of high-frequency communication.

There are many parameters to measure the performance of a film bulk acoustic resonator, and the main parameter includes the quality factor (Q value). When electrical energy is applied to the upper and lower electrodes of a bulk acoustic wave resonator, the piezoelectric layers located in the upper and lower electrodes generate acoustic waves due to the piezoelectric effect. In addition to longitudinal waves, transverse shear waves (also referred to as lateral waves or shear waves) are generated in the piezoelectric layers. The presence of transverse shear waves affects the energy of the main longitudinal waves, and the transverse shear waves cause energy loss and deteriorate the Q value of the bulk acoustic wave resonator.

For example, in a mobile terminal, there is a case where multiple frequency bands are used simultaneously, which requires the filter or diplexer in the mobile terminal to have steeper skirts and less insertion loss. The performance of a filter is determined by the resonator that constitutes the filter, and increasing the Q value of the resonator may achieve steeper skirts and less insertion loss. In addition, excessive parasitic resonance of the resonator may adversely affect the performance of the filter or duplexer.

In view of this, how to reduce the parasitic resonance of the bulk acoustic wave resonator and improve the Q value of the bulk acoustic wave resonator has become an urgent problem.

FIG. 1 is a first sectional schematic diagram of a bulk acoustic wave resonance structure 100 according to an embodiment of the present disclosure. Referring to FIG. 1, the bulk acoustic wave resonance structure 100 includes: a substrate 101; a reflection structure 102, a first electrode 103, a piezoelectric layer 104 and a second electrode 105 that are sequentially located on the substrate 101; and first gaps 107. The first electrode 103 includes a first sub-electrode 131 located in a first region 106 and second sub-electrodes 132 located in a second region outside the first region 106. The piezoelectric layer 104 in the first region 106 is in direct contact with the first sub-electrode 131 and the second electrode 105. The first gaps 107 are located between the piezoelectric layer 104 and the second sub-electrode 132. An orthographic projection of each of the first gaps 107 on the substrate 101 is located around the first region 106.

It should be noted that the bulk acoustic wave resonance structure 100 illustrated in FIG. 1 is a local sectional schematic diagram highlighting the first electrode 103 in order to describe the positions of all parts of the first electrode 103 intuitively. The bulk acoustic wave resonance structure illustrated in FIG. 1 is only an example of the embodiment of the present disclosure, and is not used to limit the features of the bulk acoustic wave resonance structure in the embodiment of the present disclosure. Other examples of the bulk acoustic wave resonance structure of the embodiment of the present disclosure are also shown in the following embodiments.

In practical applications, the composition material of the substrate 101 may include silicon (Si), germanium (Ge) and so on.

Exemplarily, the first electrode 103 can be called a lower electrode, and correspondingly, the second electrode 105 can be called an upper electrode. Electrical energy can be applied to the bulk acoustic wave resonance structure 100 through the lower electrode and the upper electrode. The composition materials of the first electrode 103 and the second electrode 105 may be the same, and the composition material may include conductive metals such as aluminum (Al), molybdenum (Mo), ruthenium (Ru), iridium (Ir), chromium (Cr) or platinum (Pt) or conductive materials consist of alloys of the above conductive metals. Exemplarily, the composition materials of the first electrode 103 and the second electrode 105 are both molybdenum (Mo).

In practical application, the piezoelectric layer 104 can be used to generate vibration according to the inverse piezoelectric characteristics, and convert the electrical signal loaded on the first electrode 103 and the second electrode 105 into the acoustic wave signal, so as to realize the conversion from electrical energy to mechanical energy.

Exemplarily, the composition material of the piezoelectric layer 104 includes a material having piezoelectric characteristics. For example, aluminum nitride, zinc oxide, lithium tantalate, lead zirconate titanate, barium titanate, and the like. The composition material of the piezoelectric layer 104 may further include a material having piezoelectric characteristics by doping, which may be doped with a transition metal or a rare metal, for example, scandium-doped aluminum nitride and the like.

Here, the reflection structure 102 is used to reflect the acoustic wave signal. When the acoustic wave signal generated by the piezoelectric layer 104 propagates toward the reflection structure 102, the acoustic wave signal may be totally reflected at the interface where the first electrode 103 is in contact with the reflection structure 102, so that the acoustic wave signal is reflected back into the piezoelectric layer 104. In this way, the energy of the acoustic wave signal generated by the piezoelectric layer 104 can be confined within the piezoelectric layer 104, which can reduce the energy loss of the acoustic wave signal and improve the acoustic energy of the main resonance mode of the bulk acoustic wave resonance structure.

In practical application, the bulk acoustic wave resonator further includes an upper electrode lead and a lower electrode lead. The upper electrode lead is set in the same layer as the second electrode 105 (upper electrode), and the upper electrode lead is connected with the second electrode 105 (upper electrode). The lower electrode lead is set in the same layer as the first electrode 103 (lower electrode), and the lower electrode lead is connected with the first electrode 103 (lower electrode).

It should be noted that the bulk acoustic wave resonance structure illustrated in FIG. 1 is only an example of the present disclosure. In practical application, according to the different forms of the reflection structure 102, the bulk acoustic wave resonance structure can be specifically classified as: the first type of cavity-type Film Bulk Acoustic Wave Resonator (FBAR), the second type of cavity-type FBAR and the Solid Mounted Resonator (SMR). The technical solutions provided by the embodiment of the present disclosure can be applied to the above different types of bulk acoustic wave resonance structures.

Exemplarily, when the bulk acoustic wave resonance structure 100 includes the first type of cavity-type FBAR, the reflection structure 102 includes the first cavity formed between the upwardly protruded first electrode 103 and the surface of the substrate 101. When the bulk acoustic wave resonance structure 100 includes the second type of cavity-type FBAR, the reflection structure 102 includes the second cavity formed between the downwardly recessed surface of the substrate 101 and the first electrode 103. Here, the bulk acoustic wave resonance structure 100 including the first type of cavity-type FBAR is described as an example.

In practical application, as illustrated in FIG. 1, an overlapping region where the piezoelectric layer 104 is in direct contact with the first electrode 103 and the second electrode 105 is the first region 106. A region outside the first region 106 can be referred to as the second region. The main resonance mode of the bulk acoustic wave resonance structure is generated in the first region.

In an embodiment, composition materials of the first sub-electrode 131 and the second sub-electrode 132 are the same. For example, the composition materials of the first sub-electrode 131 and the second sub-electrode 132 include molybdenum (Mo). In another embodiment, the composition materials of the first sub-electrode 131 and the second sub-electrode 132 are different. For example, the composition material of the first sub-electrode 131 includes molybdenum (Mo) and the composition material of the second sub-electrode 132 includes aluminum (Al).

Referring to FIG. 1, the first gaps 107 are located between the piezoelectric layer 104 and the second sub-electrode 132, and the first gaps 107 are located in the second region. By setting the first gaps 107, a distance between the first electrode 103 and the second electrode 105 that are close to the edge of the first region 106 is increased, so that the electric field intensity of the second region adjacent to the first region 106 can be decreased, and the parasitic resonance at the edge of the first region 106 can be reduced, which may reduce the propagation of the parasitic resonance to the resonance region, thereby improving the Q value of the bulk acoustic wave resonance structure.

Exemplarily, the composition material of the first gaps 107 includes air or a functional material for reflecting acoustic waves. For example, the first gap 107 may include a vacuum gap or a gap of other gas media. When the material of the first gaps 107 includes air, a part of the edge of the piezoelectric layer 104 can be exposed to the air, thus effectively suppressing the transverse shear wave. The first gaps 107 may also be made of functional materials with low acoustic impedance, such as silicon carbide (SiC), silicon dioxide (SiO$_2$) and the like.

Compared with the distance between the first electrode 103 and the second electrode 105 that are in the first region 106, the first gap 107 in the embodiment of the present disclosure increases the distance between the first electrode 103 and the second electrode 105 that are in the second region outside the first region 106, thereby decreasing the electric field intensity in the second region outside the first region 106. Due to the decrease of electric field intensity, the electric displacement is reduced, the effect of piezoelectric resonance is reduced, so that the parasitic resonance at the edge of the first region 106 can be reduced, to reduce the propagation of the parasitic resonance to the resonance region, thereby improving the Q value of the bulk acoustic wave resonance structure.

In some embodiments, the second sub-electrode 132 includes a first horizontal portion 1321 and a first inclination portion 1322. The first horizontal portion 1321 extends in a direction parallel to a surface of the substrate 101, and the first gap 107 is located between the first horizontal portion 1321 and the piezoelectric layer 104. The first inclination portion 1322 at least partially covers a sidewall (close to the reflection structure 102) of the piezoelectric layer 104 and is located around the first horizontal portion 1321.

Figure 2:
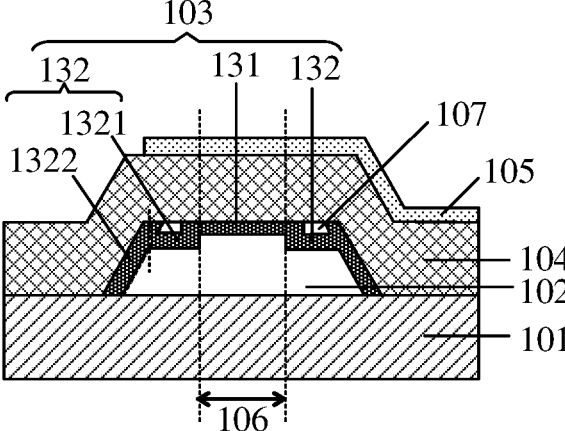
FIG. 2 is a second sectional schematic diagram of a bulk acoustic wave resonance structure according to an embodiment of the present disclosure.

Referring to FIG. 1 and FIG. 2, the first gap 107 is located between the first horizontal portion 1321 and the piezoelectric layer 104, and the first gap 107 is located in the second region. By setting the first gap 107, a distance between the first electrode 103 and the second electrode 105 that are close to the edge (the second region) of the first region 106 is increased.

As illustrated in FIG. 1, the first inclination portion 1322 having an inclination angle with respect to the surface of the substrate 101 is set close to the edge (second region) of the first region 106. The first inclination portion 1322 partially covers a sidewall (close to the reflection structure 102) of the piezoelectric layer 104. As illustrated in FIG. 2, the first inclination portion 1322 completely covers the sidewall (close to the reflection structure 102) of the piezoelectric layer 104. It should be noted that the first gap 107 illustrated in FIG. 1 has a larger volume than the first gap 107 illustrated in FIG. 2, which can suppress transverse shear waves better.

Exemplarily, a range of the inclination angle of the first inclination portion 1322 is from 10° to 80°. The inclination angle can also be improved according to the design size of bulk acoustic wave resonance structure. The first electrode 103 has a slope (i.e., the first inclination portion 1322), and the set of the slope makes the distance from the second electrode 105 to the first electrode 103 longer.

As illustrated in FIG. 1 and FIG. 2, the first inclination portion 1322 of the first electrode 103 extends along the slope of the reflection structure 102, so that the first electrode 103 after extending is in direct contact with the substrate 101, which makes the bulk acoustic wave resonance structure more stable.

In the embodiments of the present disclosure, the distance between the first electrode 103 and the second electrode 105 that are close to the edge of the first region 106 is increased by the first gap 107 and the first inclination portion 1322. In this way, the electric field line from the second electrode 105 to the first electrode 103 becomes longer, resulting in a decrease in the electric field intensity in the second region. Due to the decrease of electric field intensity, the electric displacement is reduced, and the effect of piezoelectric resonance is reduced, so that the parasitic resonance close to the edge of the first region 106 is reduced, thereby improving the Q value of the bulk acoustic wave resonance structure.

In some embodiments, each of the first end and the second end of the first electrode 103 is in direct contact with the piezoelectric layer 104 and the substrate 101. The first gap 107 is enclosed by the second sub-electrode 132 and the piezoelectric layer 104. The first end and the second end of the first electrode 103 are opposite ends.

As illustrated in FIG. 1 and FIG. 2, the first gap 107 is located between a respective one of second sub-electrodes 132 and the piezoelectric layer 104, and the first gap 107 is enclosed by the second sub-electrode 132 and the piezoelectric layer 104. The first gaps 107 can suppress lateral parasitic modes (i.e., suppress parasitic resonance) and improve the Q value.

Figure 3A:
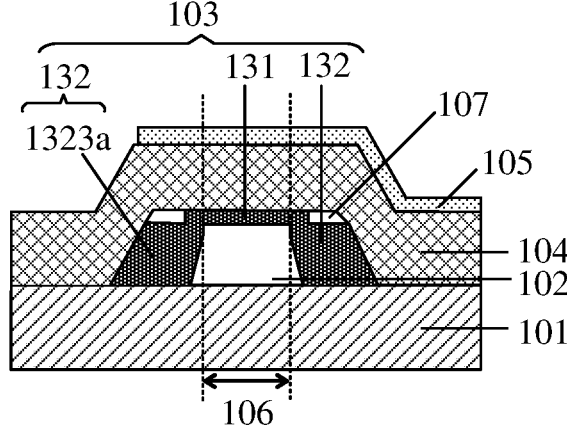
FIG. 3A is a third sectional schematic diagram of a bulk acoustic wave resonance structure according to an embodiment of the present disclosure.

In some embodiments, referring to FIG. 3A, the second sub-electrode 132 includes a second inclination portion 1323a.

The second inclination portion 1323a partially covers a sidewall (close to the reflection structure 102) of the piezoelectric layer 104, and the second inclination portion 1323a includes a top and a bottom that are opposite in a direction perpendicular to the substrate 101. The first gap 107 is located between the top and the piezoelectric layer 104, and the bottom is in direct contact with the substrate 101.

Referring to FIG. 3A, the second inclination portion 1323a having an inclination angle with respect to the surface of the substrate 101 is set close to the edge (second region) of the first region 106, and the second inclination portion 1323a partially covers a sidewall (close to the reflection structure 102) of the piezoelectric layer 104. Exemplarily, a range of the inclination angle of the second inclination portion 1323a is from 10° to 80°. The first electrode 103 has a slope (i.e., a second inclination portion 1323a), and the set of the slope makes the distance from the second electrode 105 to the first electrode 103 longer.

Compared with the first inclination portion 1322 illustrated in FIG. 1, the thickness of the second inclination portion 1323a is thicker in the direction perpendicular to the surface of the substrate 101. Exemplarily, the thickness of the second inclination portion 1323*a* in the direction perpendicular to the surface of the substrate 101 is 2 μm. In this way, the thickened second inclination portion 1323*a* extends to the surface of the substrate 101 and is in direct contact with the substrate 101.

As illustrated in FIG. 3A, the first electrode 103 has a slope (second inclination portion 1323*a*). The second inclination portion 1323*a* extends to the surface of the substrate 101 and is in direct contact with the substrate 101. In this way, the first electrode 103 after extending is in contact with the substrate 101, which makes the bulk acoustic wave resonance structure more stable.

In some embodiments, referring to FIG. 3A, the thickness of the second inclination portion 1323*a* in the direction perpendicular to the substrate 101 is equal to the thickness of the reflection structure 102 in the direction perpendicular to the substrate 101.

As illustrated in FIG. 3A, the first electrode 103 has an electrode thickened portion (second inclination portion 1323*a*). Compared with the first electrode 103 of the bulk acoustic wave resonance structure illustrated in FIG. 1 where thicknesses of all portions of the first electrode 103 are the same, the thickened second inclination portion 1323*a* can increase heat dissipation, and the thickened second inclination portion 1323*a* can further suppress lateral waves and improve the performance of the bulk acoustic wave resonance structure.

Figure 3B:
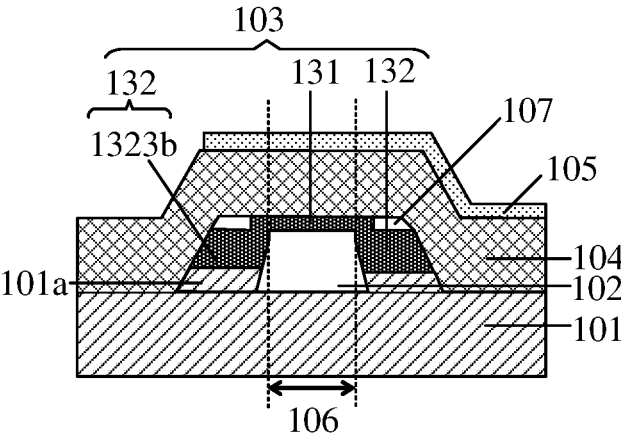
FIG. 3B is a fourth sectional schematic diagram of a bulk acoustic wave resonance structure according to an embodiment of the present disclosure.

In some embodiments, referring to FIG. 3B, the second sub-electrode 132 includes a second inclination portion 1323*b*. The second inclination portion 1323*b* partially covers a sidewall (close to the reflection structure 102) of the piezoelectric layer 104, and the second inclination portion 1323*b* includes a top and a bottom that are opposite in a direction perpendicular to the substrate 101, and the first gap 107 is located between the top and the piezoelectric layer 104. The substrate 101 includes protrusions 101*a* protruding toward the first electrode 103, and the protrusion 101*a* is in direct contact with the bottom of the second inclination portion 1323*b*. A side (remote from the first region 106) of the protrusion 101*a* is in contact with the piezoelectric layer 104. A side (close to the first region 106) of the protrusion 101*a* is in contact with the reflection structure 102.

Exemplarily, as illustrated in FIG. 3B, the sum of the thickness of the second inclination portion 1323*b* in the direction perpendicular to the substrate 101 and the thickness of the protrusion 101*a* in the direction perpendicular to the substrate 101 is equal to the thickness of the reflection structure 102 in the direction perpendicular to the substrate 101. It should be noted that the composition material of the protrusion 101*a* is the same as the composition material of the substrate 101. In the embodiment of the present disclosure, the second inclination portion 1323*b* is in direct contact with the protrusion 101*a* of the substrate 101, which makes the bulk acoustic wave resonance structure more stable.

Figure 4:
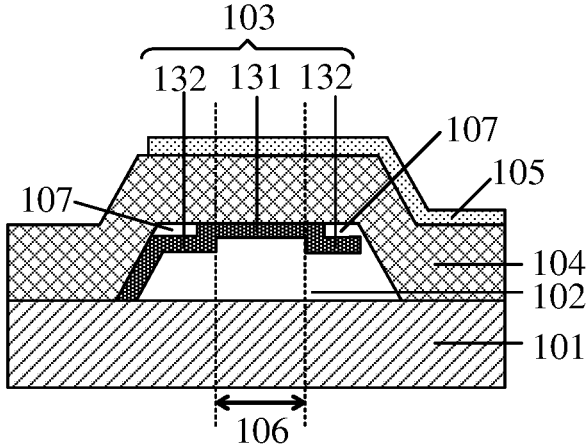
FIG. 4 is a fifth sectional schematic diagram of a bulk acoustic wave resonance structure according to an embodiment of the present disclosure.

In some embodiments, referring to FIG. 4, the first end of the first electrode 103 is in direct contact with the piezoelectric layer 104 and the substrate 101, and the second end of the first electrode 103 is exposed in the reflection structure 102 and the first gap 107, and the reflection structure 102 interconnects with the first gap 107. The first end and the second end of the first electrode 103 are opposite ends.

As illustrated in FIG. 4, the first end of the first electrode 103 is in direct contact with the piezoelectric layer 104 and the substrate 101. As illustrated in FIG. 4, the second end of the first electrode 103 is exposed in the reflection structure 102 and the first gap 107, and the reflection structure 102 interconnects with the first gap 107. For example, the composition material of the first gap 107 includes air, and the reflection structure 102 includes a cavity formed between the upwardly protruded first electrode 103 and the surface of the substrate 101. In this way, the interconnection between the reflection structure 102 and the first gap 107 can expose part of the edge of the piezoelectric layer 104 to the air, and thus the transverse shear wave can be better suppressed.

Figure 5:
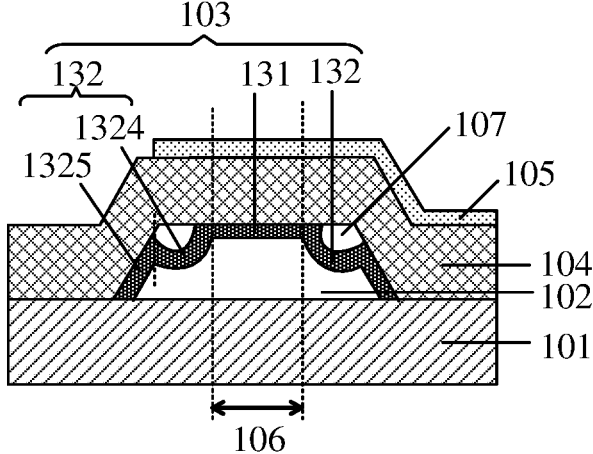
FIG. 5 is a sixth sectional schematic diagram of a bulk acoustic wave resonance structure according to an embodiment of the present disclosure.

In some embodiments, referring to FIG. 5, the second sub-electrode 132 includes a first arcuate portion 1324 and a third inclination portion 1325. The first arcuate portion 1324 protrudes toward a direction close to the reflection structure 102, and the first gap 107 is located between the first arcuate portion 1324 and the piezoelectric layer 104.

The third inclination portion 1325 partially covers a sidewall (close to the reflection structure 102) of the piezoelectric layer 104 and surrounds the first arcuate portion 1324.

Referring to FIG. 5, the first arcuate portion 1324 protrudes in a direction close to the reflection structure 102. Compared with the first electrode 103 with multiple right-angle turns, the first electrode 103 with arcuate portions is set in the present embodiment, thereby reducing the probability of fracture of the first electrode 103 and improving the stability of the bulk acoustic wave resonance structure.

As illustrated in FIG. 5, the first gap 107 is located between the first arcuate portion 1324 and the piezoelectric layer 104, and the first gap 107 is located in the second region. By setting the first gap 107, the distance between the first electrode 103 and the second electrode 105 that are close to the edge (the second region) of the first region 106 is increased.

Referring to FIG. 5, a third inclination portion 1325 having an inclination angle with respect to the surface of the substrate 101 is set close to the edge (second region) of the first region 106. The third inclination portion 1325 partially covers a sidewall (close to the reflection structure 102) of the piezoelectric layer 104. Exemplarily, a range of the inclination angle of the third inclination portion 1325 is from 10° to 80°. The inclination angle can also be improved according to the design size of bulk acoustic wave resonance structure. The first electrode 103 has a slope (i.e., the third inclination portion 1325), and the set of the slope makes the distance from the second electrode 105 to the first electrode 103 longer. In this way, the electric field line from the second electrode 105 to the first electrode 103 becomes longer, resulting in a decrease in the electric field intensity in the second region. Due to the decrease of electric field intensity, the electric displacement is reduced, the effect of piezoelectric resonance is reduced, and the parasitic resonance at the edge of the first region 106 is reduced, so that the propagation of the parasitic resonance to the resonance region is reduced, thereby improving the Q value of the bulk acoustic wave resonance structure.

As illustrated in FIG. 5, the third inclination portion 1325 of the first electrode 103 extends along the slope of the reflection structure 102, so that the first electrode 103 after extending is in direct contact with the substrate 101, which makes the bulk acoustic wave resonance structure more stable.

Figure 6:
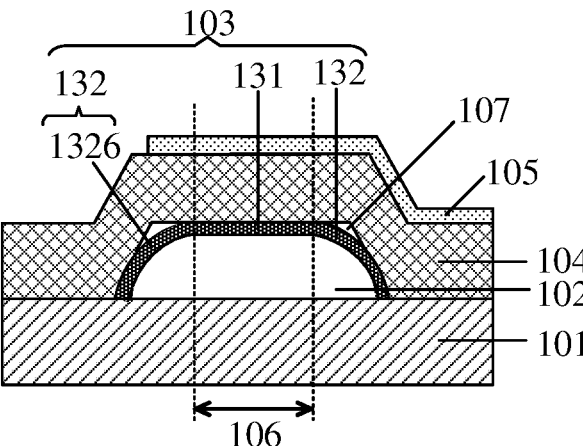
FIG. 6 is a seventh sectional schematic diagram of a bulk acoustic wave resonance structure according to an embodiment of the present disclosure.

In some embodiments, referring to FIG. 6, each of the second sub-electrodes 132 includes a second arcuate portion 1326. The second arcuate portion 1326 protrudes in a direction remote from the reflection structure 102, and the first gap 107 is located between the second arcuate portion 1326 and the piezoelectric layer 104.

Referring to FIG. 6, the second arcuate portion 1326 protrudes in a direction remote from the reflection structure 102. Compared with the first electrode 103 with multiple right-angle turns, in the present embodiment, the first electrode 103 with arcuate portions is set, and the second arcuate portion 1326 has an arch-shaped structure, so that the stress can be evenly distributed, thereby reducing the probability of fracture of the first electrode 103 and improving the stability of the bulk acoustic wave resonance structure. Furthermore, an arch-shaped second arcuate portion 1326 is set close to the edge (second region) of the first region 106. The second arcuate portion 1326 partially covers a sidewall (close to the reflection structure 102) of the piezoelectric layer 104. The first electrode 103 has the second arcuate portion 1326, so that the distance from the second electrode 105 to the first electrode 103 becomes longer. In this way, the electric field line from the second electrode 105 to the first electrode 103 becomes longer, resulting in a decrease in the electric field intensity in the second region. Due to the decrease of electric field intensity, the electric displacement is reduced, the effect of piezoelectric resonance is reduced, and the parasitic resonance at the edge of the first region 106 is reduced, so that the propagation of the parasitic resonance to the resonance region is reduced, thereby improving the Q value of the bulk acoustic wave resonance structure.

As illustrated in FIG. 6, the first gap 107 is located between the second arcuate portion 1326 and the piezoelectric layer 104, and the first gap 107 is located in the second region. By arranging the first gaps 107, the distance between the first electrode 103 and the second electrode 105 that are close to the edge (the second region) of the first region 106 is increased, so that the electric field intensity of the second region is decreased, and the parasitic resonance at the edge of the first region 106 is reduced, so as to reduce the propagation of the parasitic resonance to the resonance region, thereby improving the Q value of the bulk acoustic wave resonance structure.

As illustrated in FIG. 6, the first electrode 103 after extending is in direct contact with the substrate 101, which makes the bulk acoustic wave resonance structure more stable. An embodiment of the present disclosure provides an acoustic wave device including the bulk acoustic wave resonance structure according to the above embodiments. The acoustic wave device includes but is not limited to the filter, duplexer and multiplexer. In the embodiment of the present disclosure, for the detailed description of the bulk acoustic wave resonance structure in the acoustic wave device, reference can be made to the bulk acoustic wave resonance structure in the previous embodiments, which is not be repeated here.

FIG. 7 is a flowchart of a preparation method of a bulk acoustic wave resonance structure according to an embodiment of the present disclosure. Based on the above-mentioned bulk acoustic wave resonance structure, an embodiment of the present disclosure provides a preparation method of a bulk acoustic wave resonance structure, which includes the following operations.

In S10: a substrate is provided, and a sacrificial layer is formed on a surface of the substrate.

In S20: first grooves are formed in the sacrificial layer.

In S30: a first electrode covering the first grooves, the sacrificial layer and the substrate is formed. The first electrode includes a first sub-electrode located in a first region and second sub-electrodes located in a second region outside the first region.

In S40: second grooves are formed in the first electrode.

In S50: a sacrificial material is filled in the second grooves.

In S60: a piezoelectric layer covering the sacrificial material and the first electrode is formed.

In S70: a second electrode is formed on a side (remote from the substrate) of the piezoelectric layer. The piezoelectric layer in the first region is in direct contact with the first sub-electrode and the second electrode.

In S80: at least one etch hole penetrating through the piezoelectric layer is formed. The sacrificial material is removed through the etch hole to form first gaps, and the sacrificial layer is removed through the etch hole to form a reflection structure. Each of the first gaps is located between the piezoelectric layer and a respective one of the second sub-electrodes, and an orthographic projection of the first gap on the substrate is located around the first region.

For the composition materials of the substrate, the first electrode, the piezoelectric layer, the second electrode, and the reflection structure, reference can be made to the relevant descriptions of various embodiments in the above-mentioned bulk acoustic wave resonance structure, which is not repeated here.

Figures 8A, 8B, 8C, 8D:
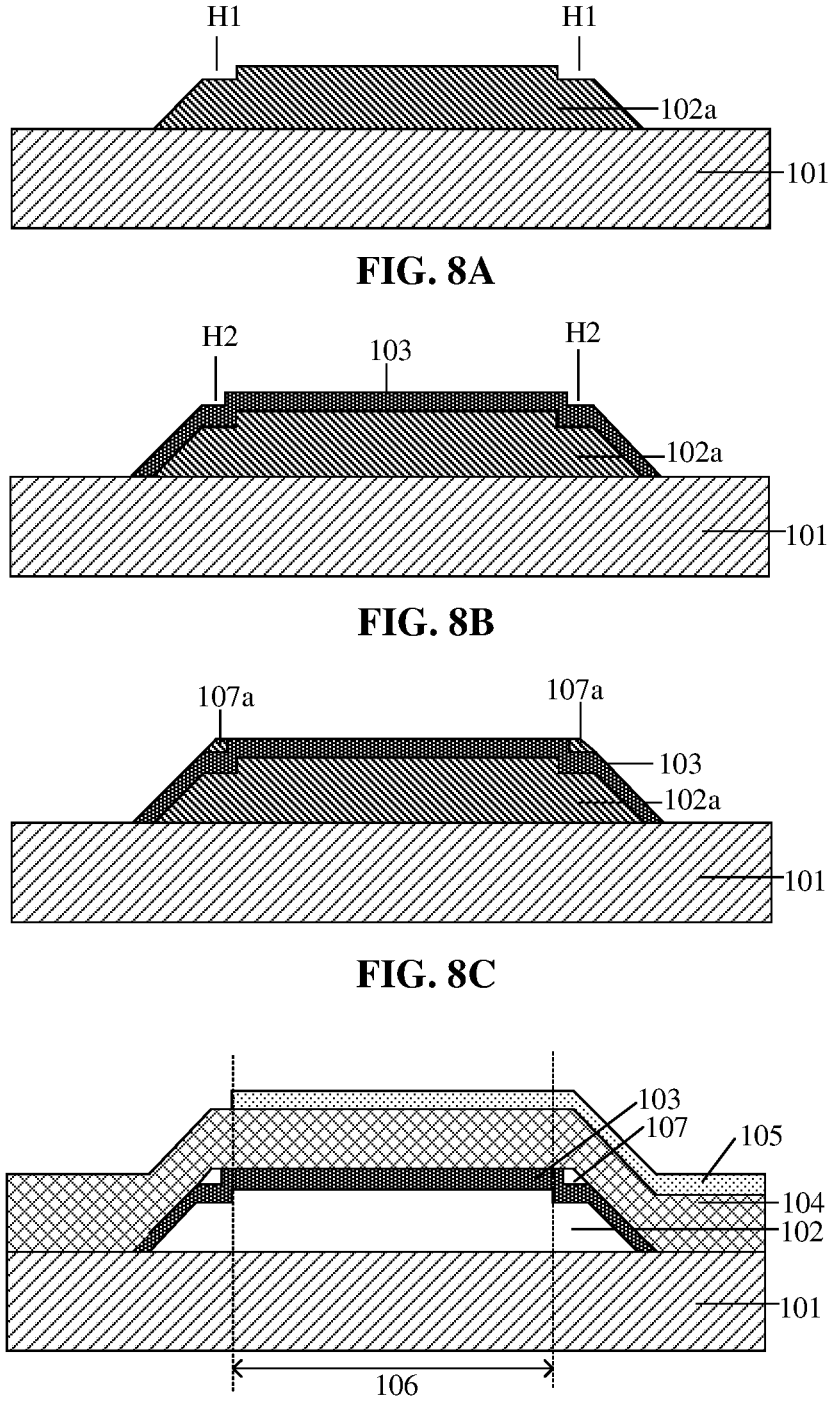
FIG. 8A to FIG. 8D are sectional schematic diagrams of a process of a preparation method of a bulk acoustic wave resonance structure according to an embodiment of the present disclosure.

FIG. 8A to FIG. 8D are sectional schematic diagrams of a process of a preparation method of a bulk acoustic wave resonance structure according to an exemplary embodiment. Referring to FIG. 8A, the operations S10 to S20 are performed. In some embodiments, a sacrificial material is deposited on the substrate 101, the sacrificial material is etched to form a sacrificial layer 102a, and the sacrificial layer 102a is etched to form the first grooves H1. Exemplarily, the composition material of the sacrificial layer 102a includes, but is not limited to, phosphosilicate glass (PSG) or silicon dioxide. Taking the composition material of the sacrificial layer 102a being silicon dioxide as an example, Silane ($SiH_4$) and oxygen ($O_2$) may be used as the reaction gas to form the sacrificial layer 102a on a first surface of the substrate 101 by a chemical vapor deposition process.

As illustrated in FIG. 8A, the sacrificial layer 102a may be formed on the substrate 101, and the sacrificial layer 102a protrudes from the upper surface of the substrate 101. The sacrificial layer 102a can be removed in the subsequent process to form an upwardly protruded cavity-type reflection structure 102 (refer to FIG. 8D).

Referring to FIG. 8A, the first grooves H1 are formed in the sacrificial layer 102a through an etching process. The etching process includes, but is not limited to, dry etching and wet etching.

Referring to FIG. 8B, the operations S30 to S40 are performed. The first electrode material covering the first grooves H1, the sacrificial layer 102a and the substrate 101 is formed, and the first electrode material is patterned to form the first electrode 103. As illustrated in FIG. 8B, in an example, the second grooves H2 are formed in the first electrode 103 through an etching process. In another example, due to the morphological features of the first groove H1, the second grooves H2 are formed while the first electrode 103 is deposited.

Referring to FIG. 8C, operation S50 is performed. The sacrificial material is deposited in the second grooves H2, and the sacrificial material is etched to form gap sacrificial layers 107a. Exemplarily, the composition material of the gap sacrificial layers 107a is the same as the composition material of the sacrificial layer 102a. It should be noted that, in an example, the gap sacrificial layers 107a may be removed in the subsequent process to form the first gaps 107 composed of air (refer to FIG. 8D). In another example, the gap sacrificial layers 107a may not be removed in the subsequent process, and the first gaps 107 (not shown) composed of the sacrificial material such as silicon dioxide may be formed.

Referring to FIG. 8D, the operations S60 to S70 are performed. The piezoelectric layer 104 covering the gap sacrificial layers 107a and the first electrode 103 is formed. The second electrode material covering the surface of the piezoelectric layer 104 is formed, and the second electrode material is patterned to form the second electrode 105.

In practical application, a region where the piezoelectric layer 104 is in direct contact with the first electrode 103 and the second electrode 105 is the first region 106. A region outside the first region 106 can be referred to as the second region.

It should be noted that before depositing the first electrode 103, a seed layer can be firstly deposited for improving the crystallographic axis orientation of the lower electrode material, such that the crystal lattice is closer to the piezoelectric layer, and the crystal lattice defects in the subsequently deposited piezoelectric layer are reduced. At the same time, the seed layer can also serve as an etch blocking layer for the first electrode 103. Exemplarily, the composition material of the seed layer is the same as the composition material of the piezoelectric layer.

Referring to FIG. 8D, operation S80 is performed. Etch hole(s) is formed, and the gap sacrificial layers 107a are removed through the etch hole to form the first gaps 107. The sacrificial layer 102a is removed through the etch hole to form a reflection structure 102.

In one embodiment, the sacrificial layer 102a is removed by releasing the etchant through the etch hole. The etch hole can penetrate the piezoelectric layer 104 and the sacrificial layer 102a to expose the surface of the substrate 101. In another embodiment, the etch hole may only penetrate the piezoelectric layer 104 to expose the surface of the sacrificial layer 102a, that is, the etch hole may not have to penetrate the sacrificial layer 102a.

For example, a suitable etchant is selected and is injected into the etch hole, so that the etchant contacts with the exposed sacrificial layer 102a and undergoes a chemical reaction to generate gaseous products to remove the sacrificial layer 102a.

Specifically, when the composition material of the sacrificial layer 102a is silicon dioxide, a dry etching process can be adopted, and hydrogen fluoride (HF) is selected as an etchant to remove the sacrificial layer 102a. After hydrogen fluoride reacts with the sacrificial layer 102a exposed through the etch hole, gaseous silicon tetrafluoride ($SiF_4$) and gaseous water are generated.

It should be noted that the specific operation of removing the gap sacrificial layers 107a through the etch hole to form the first gaps 107 can refer to the specific process of removing the sacrificial layer 102a through the etch hole to form the reflection structure 102, which is not repeated here.

In some embodiments, the method further includes thinning the second electrode 105. By thinning the second electrode 105, frequency modulation for the bulk acoustic wave resonance structure can be further performed.

In the embodiment of the present disclosure, by forming the first gaps 107 in the second region outside the first region 106, the distance between the first electrode 103 and the second electrode 105 that are in the region outside the first region 106 is increased, thereby decreasing the electric field intensity in the second region outside the first region 106. Due to the decrease of electric field intensity, the electric displacement is reduced, the effect of piezoelectric resonance is reduced, and the parasitic resonance at the edge of the first region 106 is reduced, so that the propagation of parasitic resonance to the resonance region is reduced, thereby improving the Q value of the bulk acoustic wave resonance structure.

Based on the above-mentioned bulk acoustic wave resonance structure, an embodiment of the present disclosure provides another preparation method of a bulk acoustic wave resonance structure, which includes following operations.

Operation 1: a substrate is provided, and a sacrificial layer is formed on a surface of the substrate.

Operation 2: the sacrificial layer is etched to remove a part of the sacrificial layer to form first grooves.

Operation 3: a first electrode material is filled in the first grooves.

Operation 4: a first electrode covering the first electrode material, the sacrificial layer and the substrate is formed. The first electrode includes a first sub-electrode located in a first region and second sub-electrodes located in a second region outside the first region.

Operation 5: the first electrode is etched to remove a part of the first electrode to form second grooves. The second grooves expose a part of the first electrode material.

Operation 6: a sacrificial material is filled in the second grooves.

Operation 7: a piezoelectric layer covering the sacrificial material and the first electrode is formed.

Operation 8: a second electrode is formed on a side (remote from the substrate) of the piezoelectric layer. The piezoelectric layer in the first region is in direct contact with the first sub-electrode and the second electrode.

Operation 9: at least one etch hole penetrating through the piezoelectric layer is formed. The sacrificial material is removed through the etch hole to form first gaps, and the sacrificial layer is removed through the etch hole to form a reflection structure. Each of the first gaps is located between the piezoelectric layer and a respective one of the second sub-electrodes, and an orthographic projection of the first gap on the substrate is located around the first region.

Here, the bulk acoustic wave resonance structure illustrated in FIG. 2 will be described as an example. It should be note that, for the specific process of forming the substrate 101, the reflection structure 102, the first electrode 103, the piezoelectric layer 104, and the second electrode 105 in the operations 1 to 9, reference can be made to the description in the above-mentioned flowchart of the operations S10 to S80.

Figure 9A:
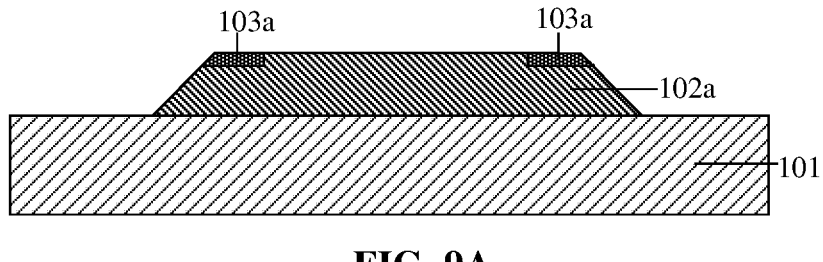
FIG. 9A to FIG. 9E are sectional schematic diagrams of a process of another preparation method of a bulk acoustic wave resonance structure according to an embodiment of the present disclosure.

FIG. 9A to FIG. 9E are sectional schematic diagrams of a process of a preparation method of a bulk acoustic wave resonance structure according to an embodiment of the present disclosure. Referring to FIG. 9A, the operations 1 to 3 are performed. In some embodiments, a sacrificial material is deposited on the substrate 101, the sacrificial material is etched to form a sacrificial layer 102a, and the sacrificial layer 102a is etched to form the first grooves. The first electrode material 103a covering the first grooves is formed.

As illustrated in FIG. 9A, the sacrificial layer 102a may be formed on the substrate 101 with the sacrificial layer 102a protruding from the upper surface of the substrate 101. The sacrificial layer 102a may be removed in the subsequent process to form an upwardly protruded cavity-type reflection structure 102 (refer to FIG. 9E).

Figure 9B:
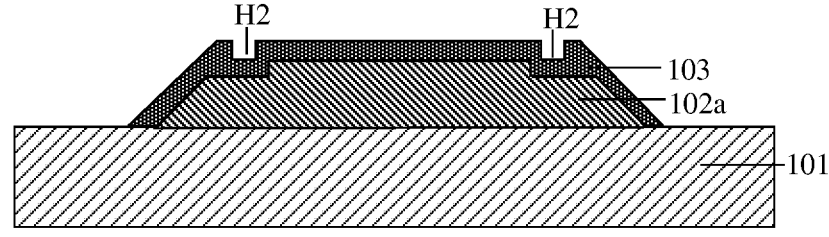

Referring to FIG. 9B, the operations 4 to 5 are performed. The first electrode material is deposited and the first electrode material is patterned to form the first electrode 103. The second grooves H2 are formed in the first electrode 103 by etching. The etching process includes, but is not limited to, dry etching and wet etching.

Figure 9C:
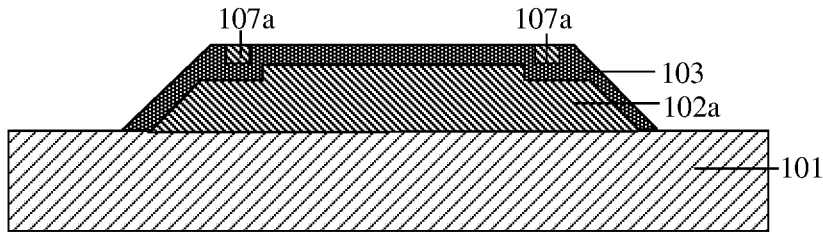

Referring to FIG. 9C, the operation 6 is performed. The sacrificial material is deposited in the second grooves H2 and the sacrificial material is etched to form gap sacrificial layers 107*a*. Exemplarily, the composition material of the gap sacrificial layers 107*a* is the same as the composition material of the sacrificial layer 102*a*. It should be noted that, in an example, the gap sacrificial layers 107*a* may be removed in the subsequent process to form the first gaps 107 composed of air (refer to FIG. 9E). In another example, the gap sacrificial layers 107*a* may not be removed in the subsequent process, so as to form the first gap 107 (not shown) composed of the sacrificial material such as silicon dioxide.

Figure 9D:
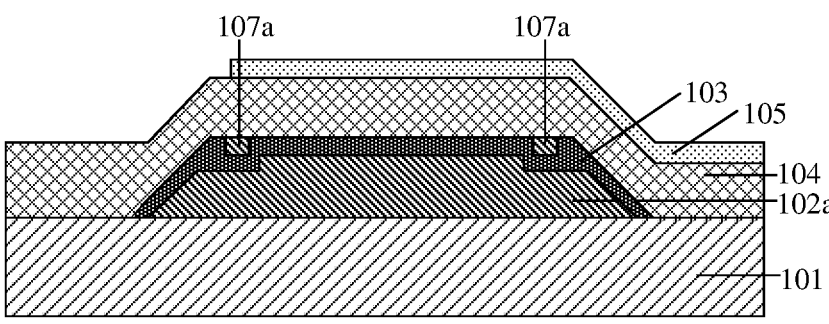
Figure 9E:
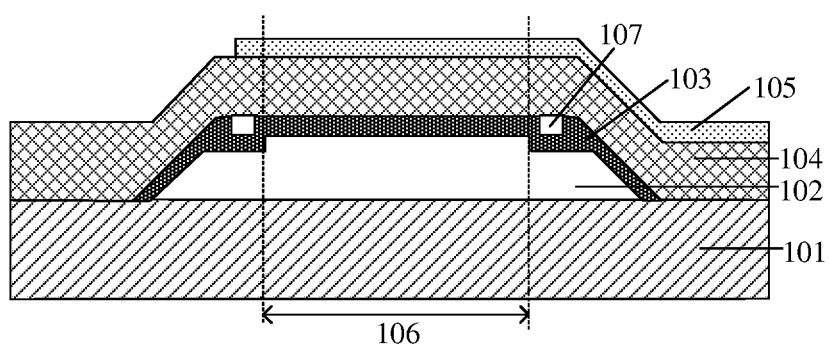

Referring to FIG. 9D and FIG. 9E, the operations 7 to 9 are performed. For the specific process of the operations 7 to 9, reference can be made to the description of the operations S60 to S80 in the flowchart illustrated in FIG. 7 and will not be repeated here.

In the embodiment of the present disclosure, by forming the first gap 107 in the region (i.e., second region) outside the first region 106, the distance between the first electrode 103 and the second electrode 105 that are in the second region outside the first region 106 is increased, thereby decreasing the electric field intensity in the second region outside the first region 106. Due to the decrease of electric field intensity, the electric displacement is reduced, the effect of piezoelectric resonance is reduced, and the parasitic resonance at the edge of the first region 106 is reduced, so that the propagation of the parasitic resonance to the resonance region is reduced, thereby improving the Q value of the bulk acoustic wave resonance structure.

Based on the above-mentioned bulk acoustic wave resonance structure, an embodiment of the present disclosure provides another preparation method of a bulk acoustic wave resonance structure, which includes following operations.

Operation 1: a substrate is provided, and a sacrificial layer is formed on a surface of the substrate.

Operation 2: first electrode material protrusions are formed on the substrate. Each of the first electrode material protrusions covers a part of a sidewall of the sacrificial layer.

Operation 3: a first electrode covering the first electrode material protrusions, the sacrificial layer and the substrate is formed. The first electrode includes a first sub-electrode located in a first region and second sub-electrodes located in a second region outside the first region.

Operation 4: the first electrode is etched to remove a part of the first electrode to form second grooves.

Operation 5: a sacrificial material is filled in the second grooves.

Operation 6: a piezoelectric layer covering the sacrificial material and the first electrode is formed.

Operation 7: a second electrode is formed on a side (remote from the substrate) of the piezoelectric layer. The piezoelectric layer in the first region is in direct contact with the first sub-electrode and the second electrode.

Operation 8: at least one etch hole penetrating through the piezoelectric layer is formed, the sacrificial material is removed through the etch hole to form first gaps, and the sacrificial layer is removed through the etch hole to form a reflection structure. Each of the first gaps is located between the piezoelectric layer and a respective one of the second sub-electrodes, and an orthographic projection of the first gap on the substrate is located around the first region.

Here, the bulk acoustic wave resonance structure illustrated in FIG. 3A will be described as an example. It should be note that, for the specific process of forming the substrate 101, the reflection structure 102, the first electrode 103, the piezoelectric layer 104, and the second electrode 105 in the operations 1 to 8, reference can be made to the description in the above-mentioned flowchart illustrated in FIG. 7.

Figure 10A:
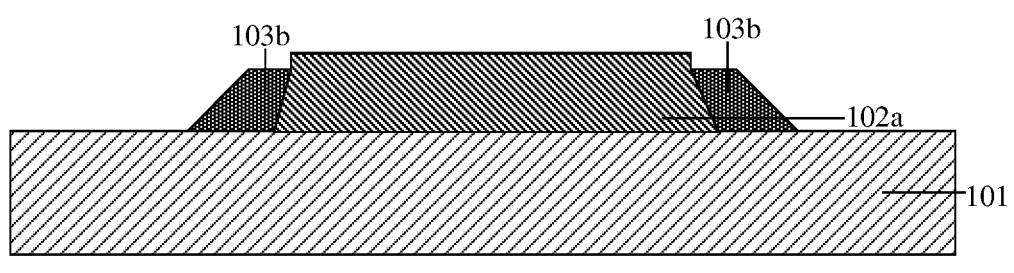
FIG. 10A to FIG. 10D are sectional schematic diagrams of a process of yet another preparation method of a bulk acoustic wave resonance structure according to an embodiment of the present disclosure.

FIG. 10A to FIG. 10D are sectional schematic diagrams of a process of a preparation method of a bulk acoustic wave resonance structure according to an embodiment of the present disclosure. Referring to FIG. 10A, the operations 1 to 2 are performed. In some embodiments, a sacrificial material is deposited on the substrate 101, and the sacrificial material is etched to form a sacrificial layer 102*a*. As illustrated in FIG. 10A, the sacrificial layer 102*a* may be formed on the substrate 101 with the sacrificial layer 102*a* protruding from an upper surface of the substrate 101. The sacrificial layer 102*a* may be removed in the subsequent process to form an upwardly protruded cavity-type reflection structure 102 (refer to FIG. 10D).

Referring to FIG. 10A, the first electrode material is deposited on the substrate 101 and the first electrode material is patterned to form the first electrode material protrusions 103*b*. Each of the first electrode material protrusions 103*b* covers a part of a sidewall of the sacrificial layer 102*a*. Exemplarily, the composition material of the first electrode material protrusions 103*b* is the same as the composition material of the first electrode 103. It should be noted that, as illustrated in FIG. 10A, the height of the first electrode material protrusion 103*b* in the direction perpendicular to the substrate 101 is smaller than the height of the sacrificial layer 102*a* in the direction perpendicular to the substrate 101.

Figure 10B:
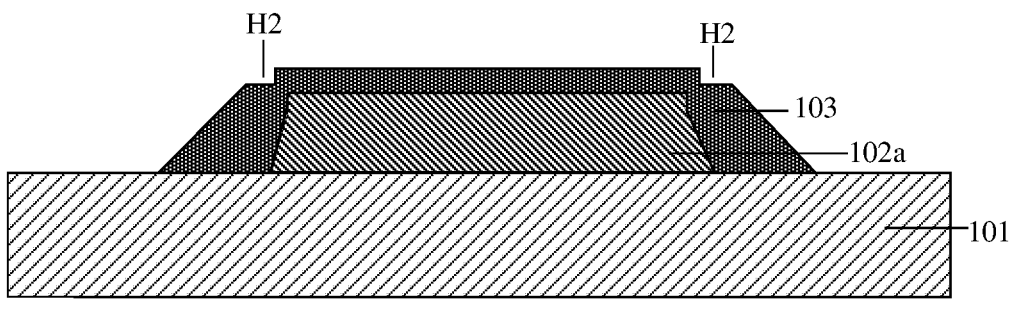

Referring to FIG. 10B, the operations 3 to 4 are performed. The first electrode material is deposited to form the first electrode material layer which covers the substrate 101 and the first electrode material protrusions 103*b* and extends to the surface of the sacrificial layer 102*a*, and the first electrode material layer is patterned to form the first electrode 103. The first electrode material protrusions 103*b* and the first electrode material layer constitute the first electrode 103. It should be noted that, as illustrated in FIG. 10B, in an example, the second grooves H2 are formed in the first electrode 103 through an etching process. In another example, due to the morphological feature that each of the first electrode material protrusions 103*b* partially covers a sidewall of the sacrificial layer 102*a*, the second grooves H2 are formed simultaneously with the deposition of the first electrode 103.

Figure 10C:
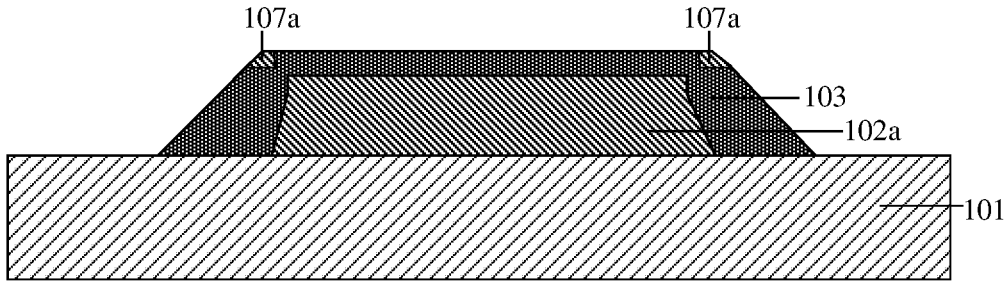

Referring to FIG. 10C, the operation 5 is performed. The sacrificial material is deposited in the second grooves H2, and the sacrificial material is etched to form gap sacrificial layers 107*a*. Exemplarily, the composition material of the gap sacrificial layers 107*a* is the same as the composition material of the sacrificial layer 102*a*. It should be noted that the gap sacrificial layers 107*a* may be removed in the subsequent process to form the first gaps 107 (refer to FIG. 10D).

Figure 10D:
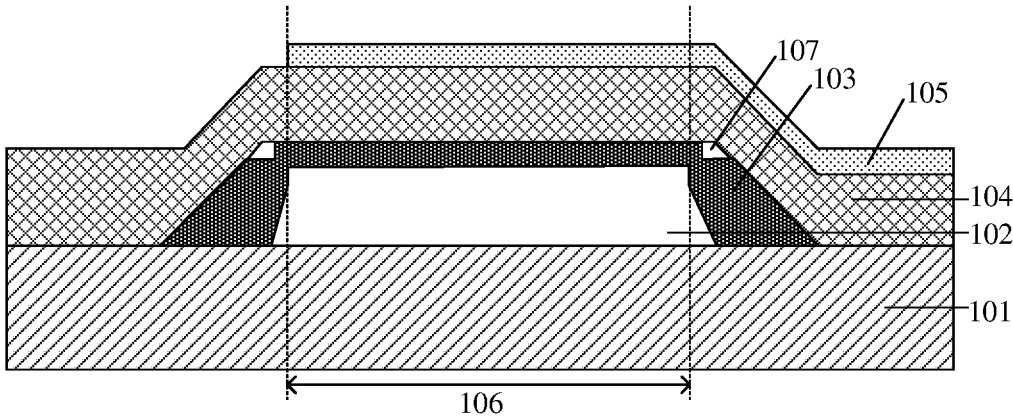

Referring to FIG. 10D, the operations 6 to 8 are performed. For the specific process of the operations 6 to 8, reference can be made to the description of the operations S60 to S80 in the flowchart illustrated in FIG. 7, which will not be repeated here.

In the embodiment of the present disclosure, by forming the first gap 107 in the region (i.e., second region) outside the first region 106, the distance between the first electrode 103 and the second electrode 105 that are in the second region outside the first region 106 is increased, so that the electric field intensity in the second region outside the first region 106 is decreased, and the parasitic resonance at the edge of the first region 106 is reduced, to reduce the propagation of the parasitic resonance to the resonance region, thereby improving the Q value of the bulk acoustic wave resonance structure. In addition, the first electrode 103 after extending is in contact with the substrate 101, so that the bulk acoustic wave resonance structure is more stable. Compared with the first electrode 103 of the bulk acoustic wave resonance structure where thicknesses of all portions of the first electrode 103 are the same, in the embodiment of the present disclosure, the thickened first electrode 103 can increase heat dissipation, and the thickened first electrode 103 can further suppress lateral waves and improve the performance of the bulk acoustic wave resonance structure.

It is to be understood that "an embodiment" or "some embodiments" throughout the specification mean that a particular feature, structure or characteristic associated with the embodiment is included in at least one embodiment of the disclosure. Thus, "in an embodiment" or "in some embodiments" appearing throughout the specification do not necessarily refer to the same embodiment. In addition, these particular features, structures or characteristics may be combined in one or more embodiments in any suitable manner. It is to be understood that in the various embodiments of the disclosure, the serial numbers of the aforementioned processes do not imply the order of execution. The order of execution of the processes should be determined by their function and inherent logic, and should not constitute any limitation on the implementation processes of the embodiments of the disclosure. The above serial numbers of the embodiments of the disclosure are only for description and do not represent the advantages and disadvantages of the embodiments.

The above is only the specific implementations of the disclosure, but the scope of protection of the disclosure is not limited thereto. Any variations or replacements apparent to those skilled in the art within the technical scope disclosed by the disclosure shall fall within the scope of protection of the disclosure.

The invention claimed is:

1. A bulk acoustic wave resonance structure, comprising:
a substrate;
a reflection structure, a first electrode, a piezoelectric layer and a second electrode that are sequentially located on the substrate;
wherein the first electrode comprises a first sub-electrode located in a first region and second sub-electrodes located in a second region outside the first region;
the piezoelectric layer in the first region is in direct contact with the first sub-electrode and the second electrode; and
first gaps, each of the first gaps is located between the piezoelectric layer and a respective one of the second sub-electrodes, wherein an orthographic projection of each of the first gaps on the substrate is located around the first region;
wherein a first end of the first electrode is in direct contact with the piezoelectric layer and the substrate, and a second end of the first electrode is exposed in the reflection structure and the first gap, the reflection structure interconnects with the first gap; and the first end and the second end of the first electrode are opposite ends.

2. The bulk acoustic wave resonance structure of claim 1, wherein the second sub-electrode comprises a first horizontal portion and a first inclination portion;
the first horizontal portion extends in a direction parallel to a surface of the substrate, and the first gap is located between the first horizontal portion and the piezoelectric layer; and
the first inclination portion at least partially covers a sidewall, close to the reflection structure, of the piezoelectric layer and is located around the first horizontal portion.

3. The bulk acoustic wave resonance structure of claim 2, wherein the first gap is enclosed by the second sub-electrode and the piezoelectric layer.

4. The bulk acoustic wave resonance structure of claim 1, wherein the second sub-electrode comprises a second inclination portion; and
the second inclination portion partially covers a sidewall, close to the reflection structure, of the piezoelectric layer; the second inclination portion comprises a top and a bottom that are opposite in a direction perpendicular to the substrate, the first gap is located between the top and the piezoelectric layer, and the bottom is in direct contact with the substrate.

5. The bulk acoustic wave resonance structure of claim 4, wherein a thickness of the second inclination portion in the direction perpendicular to the substrate is equal to a thickness of the reflection structure in the direction perpendicular to the substrate.

6. The bulk acoustic wave resonance structure of claim 1, wherein the second sub-electrode comprises a first arcuate portion and a third inclination portion;
the first arcuate portion protrudes toward a direction close to the reflection structure, and the first gap is located between the first arcuate portion and the piezoelectric layer; and
the third inclination portion partially covers a sidewall, close to the reflection structure, of the piezoelectric layer, and is located around the first arcuate portion.

7. The bulk acoustic wave resonance structure of claim 1, wherein the second sub-electrode comprises a second arcuate portion; and
the second arcuate portion protrudes in a direction remote from the reflection structure, and the first gap is located between the second arcuate portion and the piezoelectric layer.

8. The bulk acoustic wave resonance structure of claim 1, wherein a composition material of the first gap comprises silicon carbide or silicon dioxide.

9. An acoustic wave device, comprising the bulk acoustic wave resonance structure of claim 1.

10. A preparation method of a bulk acoustic wave resonance structure, comprising:
providing a substrate, and forming a sacrificial layer on a surface of the substrate;
etching the sacrificial layer to remove a part of the sacrificial layer to form first grooves;
filling a first electrode material in the first grooves;
forming a first electrode covering the first electrode material, the sacrificial layer, and the substrate; wherein the first electrode comprises a first sub-electrode located in a first region and second sub-electrodes located in a second region outside the first region;

etching the first electrode to remove a part of the first electrode to form second grooves; wherein the second grooves expose a part of the first electrode material;

filling a sacrificial material in the second grooves;

forming a piezoelectric layer covering the sacrificial material and the first electrode;

forming a second electrode on a side, remote from the substrate, of the piezoelectric layer; wherein the piezoelectric layer in the first region is in direct contact with the first sub-electrode and the second electrode;

forming at least one etch hole penetrating through the piezoelectric layer, removing the sacrificial material through the at least one etch hole to form first gaps, and removing the sacrificial layer through the at least one etch hole to form a reflection structure; wherein each of the first gaps is located between the piezoelectric layer and a respective one of the second sub-electrodes, and an orthographic projection of the first gap on the substrate is located around the first region;

wherein a first end of the first electrode is in direct contact with the piezoelectric layer and the substrate, and a second end of the first electrode is exposed in the reflection structure and the first gap, the reflection structure interconnects with the first gap; and the first end and the second end of the first electrode are opposite ends.

11. A preparation method of a bulk acoustic wave resonance structure, comprising:

providing a substrate, and forming a sacrificial layer on a surface of the substrate;

forming first electrode material protrusions on the substrate; wherein each of the first electrode material protrusions covers a part of a sidewall of the sacrificial layer;

forming a first electrode covering the first electrode material protrusions, the sacrificial layer and the substrate; wherein the first electrode comprises a first sub-electrode located in a first region and second sub-electrodes located in a second region outside the first region;

etching the first electrode to remove a part of the first electrode to form second grooves;

filling a sacrificial material in the second grooves;

forming a piezoelectric layer covering the sacrificial material and the first electrode;

forming a second electrode on a side, remote from the substrate, of the piezoelectric layer; wherein the piezoelectric layer in the first region is in direct contact with the first sub-electrode and the second electrode;

forming at least one etch hole penetrating through the piezoelectric layer, removing the sacrificial material through the at least one etch hole to form first gaps, and removing the sacrificial layer through the at least one etch hole to form a reflection structure; wherein each of the first gaps is located between the piezoelectric layer and a respective one of the second sub-electrodes, and an orthographic projection of the first gap on the substrate is located around the first region;

wherein a first end of the first electrode is in direct contact with the piezoelectric layer and the substrate, and a second end of the first electrode is exposed in the reflection structure and the first gap, the reflection structure interconnects with the first gap; and the first end and the second end of the first electrode are opposite ends.

\* \* \* \* \*